United States Patent
Hatakeyama et al.

(10) Patent No.: US 12,176,879 B2
(45) Date of Patent: Dec. 24, 2024

(54) ACOUSTIC WAVE DEVICE, FILTER AND MULTIPLEXER

(71) Applicant: TAIYO YUDEN CO., LTD., Tokyo (JP)

(72) Inventors: Kazushige Hatakeyama, Tokyo (JP); Jyunichi Hamasaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 392 days.

(21) Appl. No.: 17/836,752

(22) Filed: Jun. 9, 2022

(65) Prior Publication Data

US 2022/0416757 A1   Dec. 29, 2022

(30) Foreign Application Priority Data

Jun. 28, 2021 (JP) ................................. 2021-106573

(51) Int. Cl.
*H03H 9/02* (2006.01)
*H03H 9/64* (2006.01)
*H03H 9/72* (2006.01)

(52) U.S. Cl.
CPC ...... *H03H 9/02574* (2013.01); *H03H 9/6483* (2013.01); *H03H 9/725* (2013.01)

(58) Field of Classification Search
CPC .. H03H 9/02; H03H 9/05; H03H 9/10; H03H 9/64; H03H 9/72
See application file for complete search history.

(56) References Cited

U.S. PATENT DOCUMENTS

| 6,552,475 | B2 * | 4/2003 | Hori | H03H 3/08 |
| | | | | 310/364 |
| 6,731,046 | B2 * | 5/2004 | Watanabe | H03H 9/02944 |
| | | | | 310/313 R |
| 7,259,032 | B2 * | 8/2007 | Murata | H03H 9/0557 |
| | | | | 257/684 |
| 8,836,449 | B2 * | 9/2014 | Pang | H03H 9/0571 |
| | | | | 333/187 |
| 9,634,641 | B2 * | 4/2017 | Nishimura | H03H 9/0576 |

(Continued)

FOREIGN PATENT DOCUMENTS

| JP | 10-13184 A | 1/1998 |
| JP | 2002-100951 A | 4/2002 |

(Continued)

*Primary Examiner* — Andrea Lindgren Baltzell
*Assistant Examiner* — Alan Wong
(74) *Attorney, Agent, or Firm* — Stein IP, LLC

(57) ABSTRACT

An acoustic wave device includes a first substrate, an acoustic wave element provided on a first surface of the piezoelectric layer, a second substrate, a first metal layer provided on the first surface and conductively connected to the acoustic wave element, a second metal layer provided on a second surface of the second substrate, a third metal layer that connects the first metal layer to the second metal layer, is thicker than the first metal layer and the second metal layer, and contains copper or silver, and a first conductive layer that covers a side surface of the third metal layer, and a third surface of the first metal layer in a region surrounding another region where the third metal layer is bonded to the first metal layer, is thinner than the third metal layer, and contains a component other than copper, silver, and tin as a main component.

13 Claims, 12 Drawing Sheets

(56) References Cited

U.S. PATENT DOCUMENTS

| | | | |
|---|---|---|---|
| 9,831,850 B2 * | 11/2017 | Kuroyanagi | H03H 9/02559 |
| 10,396,757 B2 * | 8/2019 | Kakita | H01L 23/53242 |
| 2002/0024271 A1 | 2/2002 | Hori et al. | 310/364 |
| 2004/0245891 A1 | 12/2004 | Kawachi et al. | 310/313 |
| 2007/0046142 A1 | 3/2007 | Obara et al. | 310/313 |
| 2010/0091473 A1 | 4/2010 | Kiwitt et al. | 361/782 |

FOREIGN PATENT DOCUMENTS

| | | |
|---|---|---|
| JP | 2004-234041 A | 12/2004 |
| JP | 2007-89143 A | 4/2007 |
| JP | 2010-526456 A | 7/2010 |
| JP | 2015-146523 A | 8/2015 |

\* cited by examiner

ACOUSTIC WAVE DEVICE, FILTER AND MULTIPLEXER

CROSS-REFERENCE TO RELATED APPLICATION

This application is based upon and claims the benefit of priority of the prior Japanese Patent Application No. 2021-106573, filed on Jun. 28, 2021, the entire contents of which are incorporated herein by reference.

FIELD

A certain aspect of the present invention relates to an acoustic wave device, a filter and a multiplexer.

BACKGROUND

There has been known an acoustic wave device in which an acoustic wave element is provided on a substrate, another substrate such as a lid is arranged on the acoustic wave element, and the substrate and the another substrate are connected by using a metal layer (for example, see Japanese Patent Application Publications No. 2004-364041, No. 2007-89143 and No. 2015-146523, and Japanese National Publication of International Patent Application No. 2010-526456). In an underbump metal layer, it has been known that another metal layer is provided so as to cover a side surface and an upper surface of a metal layer (for example, see Japanese Patent Application Publications No. 10-13184 and No. 2002-100951).

SUMMARY OF THE INVENTION

A piezoelectric substrate is easily charged, and if the metal layer connecting the substrate to the another substrate contains copper or silver as a main component, copper or silver ions may migrate to the acoustic wave element.

The present disclosure has been made in view of the above problem, and an object of the present disclosure is to suppress ion migration of copper or silver.

According to an aspect of the present invention, there is provided an acoustic wave device including: a first substrate having at least a part of a first surface that is a piezoelectric layer; an acoustic wave element provided on the first surface of the piezoelectric layer; a second substrate provided apart from the first substrate via the acoustic wave element and a gap; a first metal layer provided on the first surface and conductively connected to the acoustic wave element; a second metal layer provided on a second surface of the second substrate on a first substrate side; a third metal layer that connects the first metal layer to the second metal layer, is thicker than the first metal layer and the second metal layer, and contains copper or silver as a main component; and a first conductive layer that covers a side surface of the third metal layer, and a third surface of the first metal layer on a second substrate side in a region surrounding another region where the third metal layer is bonded to the first metal layer, is thinner than the third metal layer, and contains a component other than copper, silver, and tin as a main component.

DETAILED DESCRIPTION

A description will be given of an embodiment with reference to the accompanying drawings.

First Embodiment

Figure 1A:
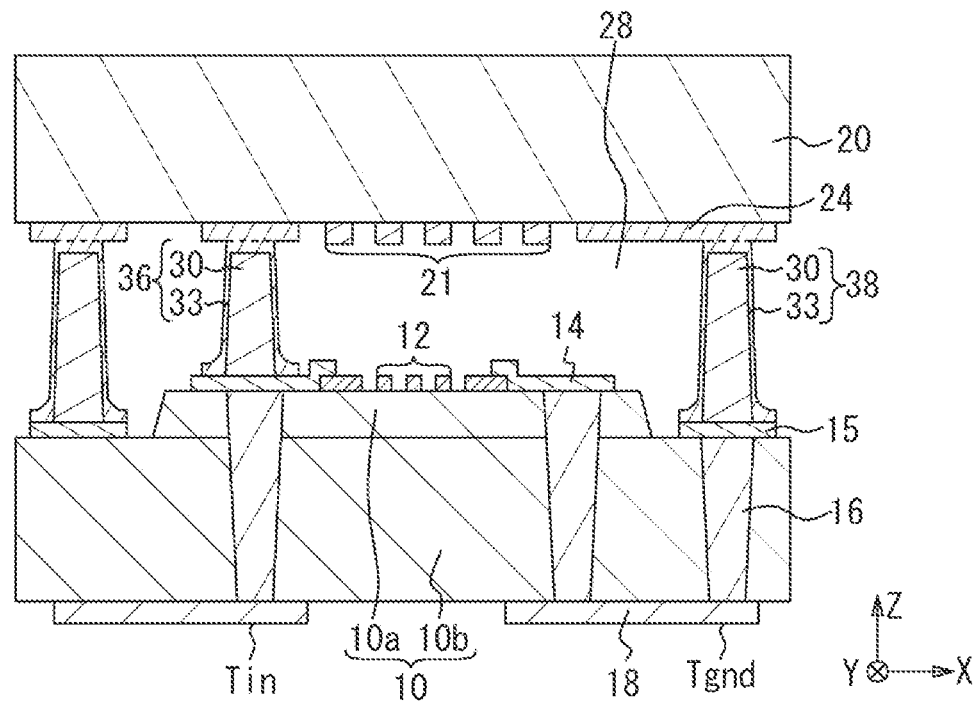
FIG. 1A is a cross-sectional view illustrating an acoustic wave device according to a first embodiment.
Figure 1B:
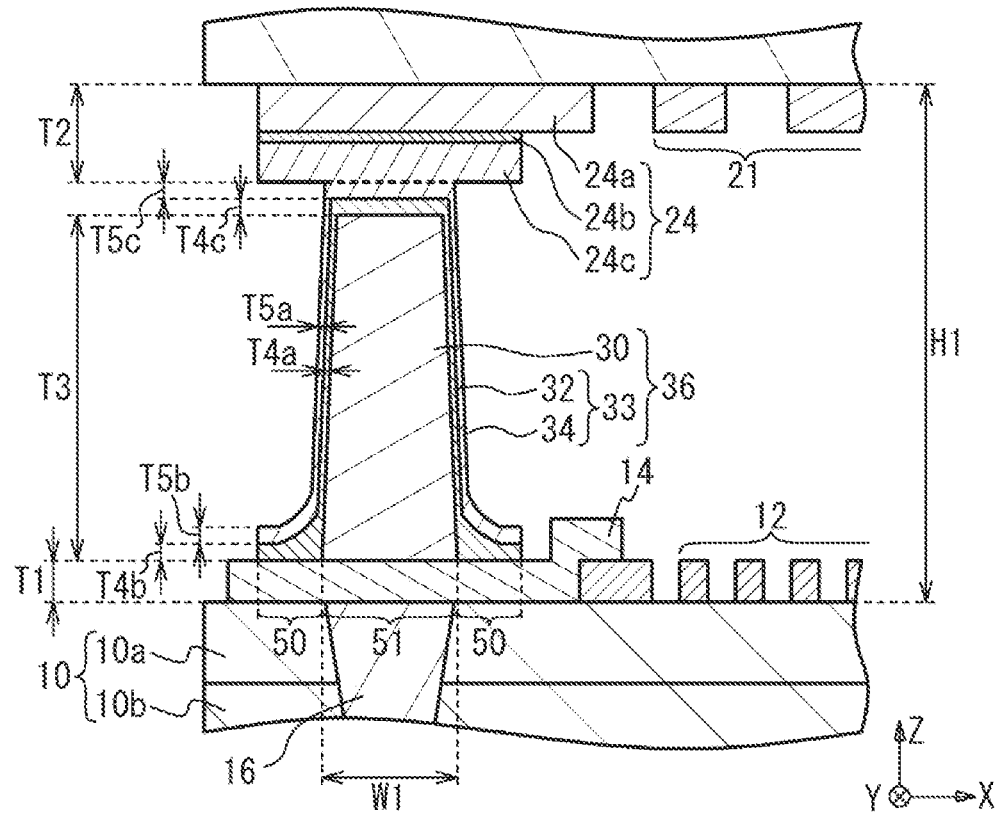
FIG. 1B is an enlarged view illustrating the vicinity of a metal pillar in FIG. 1A.

FIG. 1A is a cross-sectional view illustrating an acoustic wave device according to a first embodiment, and FIG. 1B is an enlarged view illustrating the vicinity of a metal pillar in FIG. 1A. A thickness direction of a substrate 10 is a Z direction, and plane directions of the substrate 10 are an X direction and a Y direction.

As illustrated in FIG. 1A, the substrate 10 includes a support substrate 10b and a piezoelectric substrate 10a provided on the support substrate 10b. One layer or a plurality of insulating films such as a silicon oxide film and an aluminum oxide film may be provided between the support substrate 10b and the piezoelectric substrate 10a. An acoustic wave element 12 and a metal layer 14 are provided on the piezoelectric substrate 10a. The acoustic wave element 12 is, for example, a surface acoustic wave element. The metal layer 14 functions as a wiring and a pad electrically connected to the acoustic wave element 12. The piezoelectric substrate 10a on a peripheral edge of the substrate 10 is removed, and a metal layer 15 is provided on the support substrate 10b on the peripheral edge of the substrate 10 so as to surround the acoustic wave element 12. Via wirings 16 penetrating the substrate 10 are provided. Terminals 18 are provided on a lower surface of the substrate 10. The terminals 18 function as an input terminal Tin, an output terminal (not illustrated), and a ground terminal Tgnd. The via wiring 16 electrically connects the metal layer 14 to the terminal 18. A substrate 20 is provided above the substrate 10. A metal pillar 36 is provided on the metal layer 14. An annular metal layer 38 is provided on the metal layer 15 so as to surround the acoustic wave element 12.

The piezoelectric substrate 10a is, for example, a piezoelectric substrate such as a single crystal lithium tantalate substrate, a single crystal lithium niobate substrate, or a single crystal quartz substrate. The single crystal lithium tantalate substrate and the single crystal lithium niobate substrate are, for example, rotary Y-cut X propagation substrates. The support substrate 10b is, for example, a sapphire substrate, an alumina substrate, a quartz substrate, a crystal substrate, a spinel substrate, a SiC substrate, or a silicon substrate. Each of the metal layer 14, the metal layer 15, the via wiring 16 and the terminal 18 is a single layer made of a metal layer such as a copper layer, a gold layer, a silver layer, a titanium layer, a nickel layer, and a tungsten layer, or laminated layers made of these layers.

The substrate 20 is provided above the substrate 10 via a space 28. Elements 21 and a metal layer 24 are provided on a lower surface of the substrate 20. Each element 21 is a passive element such as an inductor or a capacitor. The metal pillar 36 connects the metal layer 14 to the metal layer 24. The annular metal layer 38 connects the metal layer 15 to the metal layer 24. The acoustic wave element 12 and the elements 21 are sealed in the space 28 by the annular metal layer 38 and the substrates 10 and 20. Each of the metal pillar 36 and the annular metal layer 38 includes a metal layer 30 and a metal layer 33 that covers the metal layer 30. The substrate 20 is, for example, a sapphire substrate, an alumina substrate, a quartz substrate, a quartz crystal substrate, a spinel substrate, a SiC substrate, or a silicon substrate. The metal layer 24 is, for example, a single layer made of a metal layer such as a copper layer, a gold layer, a silver layer, a titanium layer, a nickel layer, and a tungsten layer, or laminated layers made of these layers.

As illustrated in FIG. 1B, the metal layer 33 covers a region 50 of a surface of the metal layer 14, an upper surface and a side surface of the metal layer 30. The region 50 is a region surrounding a bonding region 51 in which the metal layer 30 is bonded to the metal layer 14. The metal layer 33 may be provided in at least a region in the region 50 between the metal layer 30 and the acoustic wave element 12. The metal layer 33 includes the metal layer 32 that contacts the region 50 and the upper surface and the side surface of the metal layer 30, and the metal layer 34 that covers the metal layer 32 and contacts the metal layer 32. The metal layer 30 contains copper or silver as a main component. The metal layer 34 contains, for example, gold or aluminum as a main component. The metal layer 32 is a barrier layer that suppresses the migration of copper or silver, and contains, for example, at least one element of titanium, chromium, tantalum, nickel, tungsten, and ruthenium, or a nitride of the at least one element as a main component.

The metal layer 24 includes metal layers 24a to 24c. The metal layer 24a is electrically connected to the element 21. The metal layer 24c is directly bonded to the metal layer 34. The metal layer 24b is provided between the metal layers 24a and 24c. Since the metal layer 24c is directly bonded to the metal layer 34, for example, the main components of the metal layers 24c and 34 are the same as each other. The metal layer 24c contains, for example, gold or aluminum as a main component. The metal layer 24b is a diffusion-preventing barrier layer between the metal layers 24a and 24c, and contains, for example, at least one element of titanium, chromium, tantalum, nickel, tungsten and ruthenium, or a nitride of the at least one element as a main component.

The thicknesses of the metal layers 14, 24 and 30 are T1 to T3, respectively. The thicknesses of the metal layer 32 covering the upper surface and the side surface of the metal layer 30 are T4c and T4a, respectively, and the thicknesses of the metal layer 34 covering the upper surface and the side surface of the metal layer 32 are T5c and T5a, respectively. The thickness of the metal layer 32 covering the region 50 is T4b. The thickness of the metal layer 34 covering the region 50 is T5b.

The thicknesses T1 and T2 of the metal layers 14 and 24 are, for example, 0.1 μm to 5 μm. The thickness T3 of the metal layer 30 is, for example, 10 μm to 100 μm. Since the metal layers 14 and 24 function as wirings extending in the plane direction, the thicknesses T1 and T2 are relatively thin. The metal layer 30 has a relatively thick thickness T3 because the metal layer 30 connects the substrate 10 to the substrate 20 and the width of the space 28 in the Z direction is increased. The thickness T3 is, for example, twice or more, or five times or more the thickness T1+T2. The thickness T3 of the metal layer 30 is, for example, ½ or more or ⅘ or more of a height H1 in the Z direction between the substrates 10 and 20. A width W1 of the metal layer 30 is, for example, 20 μm to 200 μm. As the width W1 increases, an area of the chip plane increases. Therefore, an aspect ratio T3/W1 is 0.4 or more, preferably 0.6 or more, and more preferably 1.0 or more. Each of the thicknesses T4a to T4c and T5a to T5c is 20 nm to 200 nm. The thickness T4b is smaller than the thicknesses T4a and T4c, and the thickness T5b is smaller than the thicknesses T5a and T5c. For example, "T4a:T4b=T5a:T5b=2:5" is satisfied. Since the metal layer 33 covers the side surface of the metal layer 30, a cross-sectional shape of the metal layer 30 is, for example, trapezoidal, and a taper angle of the side surface is, for example, 70° or more and less than 90°.

Figure 2:
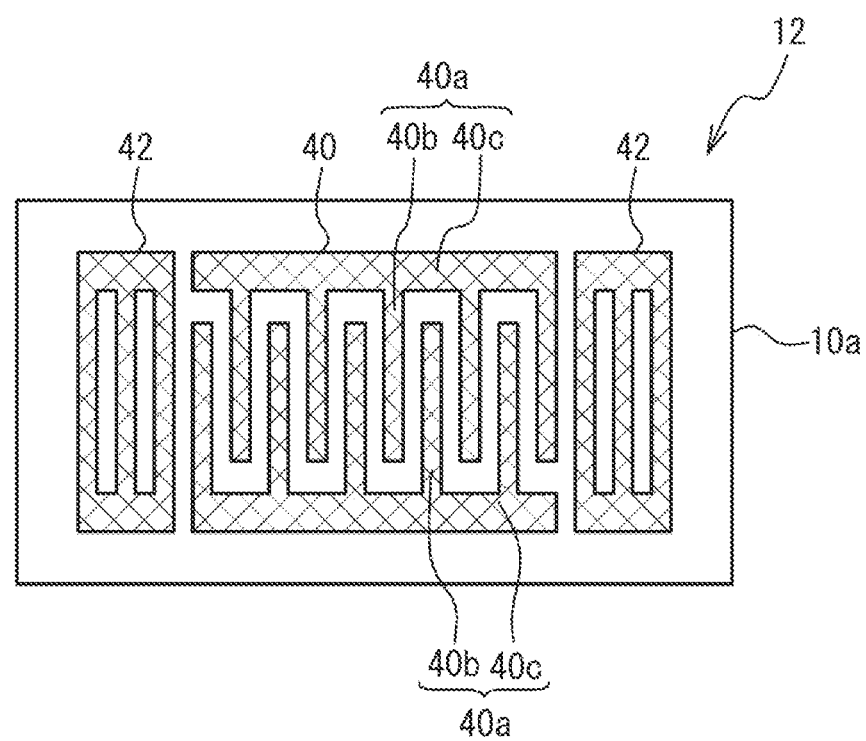
FIG. 2 is a plan view illustrating the acoustic wave element according to the first embodiment.

FIG. 2 is a plan view illustrating the acoustic wave element according to the first embodiment. As illustrated in FIG. 2, the acoustic wave element 12 is a surface acoustic wave resonator or a Lamb wave resonator. An IDT (Interdigital Transducer) 40 and reflectors 42 are formed on the piezoelectric substrate 10a. The IDT 40 has a pair of interdigital electrodes 40a facing each other. The interdigital electrode 40a has a plurality of electrode fingers 40b and a bus bar 40c that connects the plurality of electrode fingers 40b. The reflectors 42 are provided on both sides of the IDT 40. The IDT 40 excites a surface acoustic wave on the substrate 10 which is a piezoelectric substrate. The wavelength of the acoustic wave is substantially equal to a pitch between the electrode fingers 40b in one of the pair of interdigital electrodes 40a. That is, the wavelength of the acoustic wave is substantially equal to twice a pitch between the electrode fingers 40b in the pair of interdigital electrodes 40a. The IDT 40 and the reflectors 42 are formed of, for example, an aluminum film, a copper film or a molybdenum film. A protective film or a temperature compensation film may be provided on the piezoelectric substrate 10a so as to cover the IDT 40 and the reflectors 42. The acoustic wave element 12 includes an electrode that excites the acoustic wave. Therefore, the acoustic wave element 12 is covered with the space 28 so as not to limit the acoustic wave.

Figure 3A:
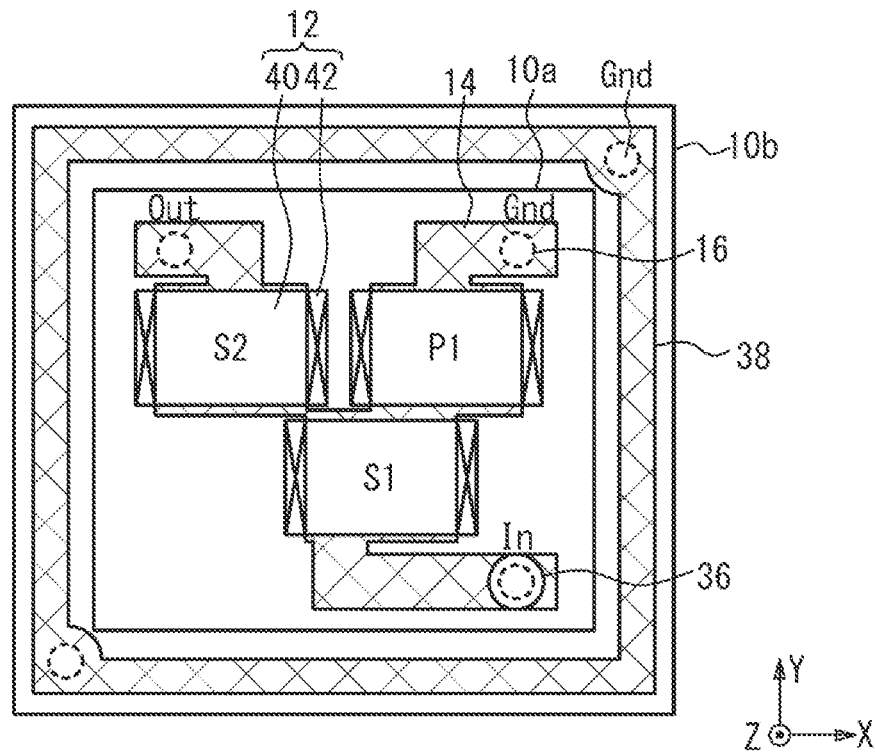
FIGS. 3A and 3B are plan views illustrating the acoustic wave device according to the first embodiment.
Figure 3B:
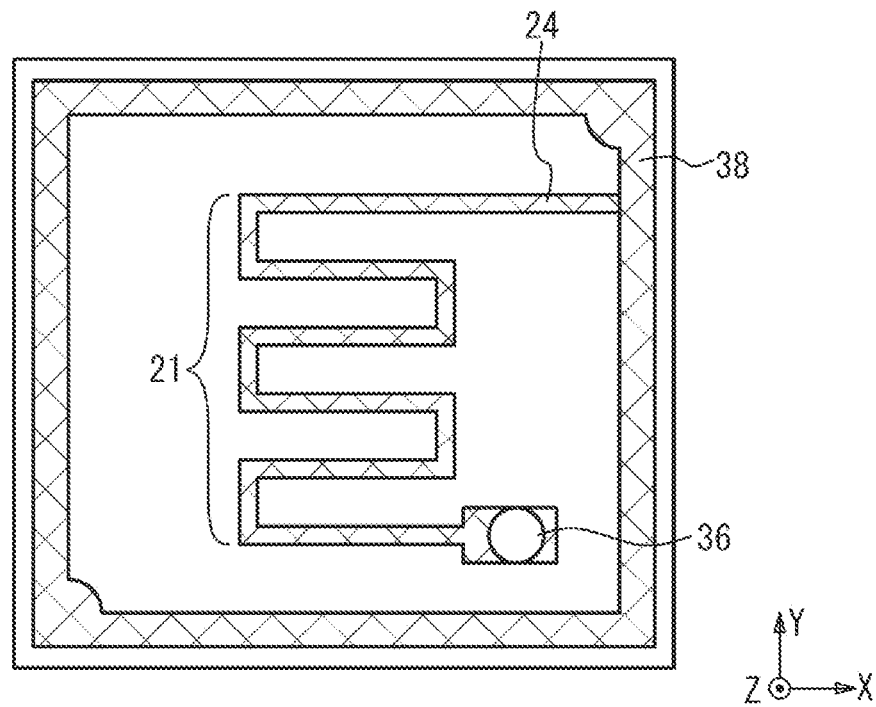

FIGS. 3A and 3B are plan views illustrating the acoustic wave device according to the first embodiment. FIG. 3A is a plan view illustrating an upper surface of the substrate 10, and FIG. 3B is a plan view illustrating the lower surface of the substrate 10 transmitted from above. As illustrated in FIG. 3A, the piezoelectric substrate 10a on the peripheral edge of the substrate 10 is removed, and the annular metal layer 38 is provided on the peripheral edge of the substrate 10. The annular metal layer 38 is connected to the ground terminal provided on the lower surface of the substrate 10 via the via wiring 16. The acoustic wave element 12 and the metal layer 14 are provided on the piezoelectric substrate 10a. The acoustic wave element 12 is an acoustic wave resonator and includes the IDT 40 and the reflectors 42. The metal layer 14 functions as a pad to which the wiring for connecting the acoustic wave element 12 and the via wiring 16 are connected. The acoustic wave element 12 includes series resonators S1 and S2 and a parallel resonator P1. The metal layer 14 functions as an input pad In, an output pad Out, and ground pads Gnd. The input pad In, the output pad Out, and the ground pads Gnd are electrically connected to the input terminal, the output terminal, and the ground terminal provided on the lower surface of the substrate 10 via the via wirings 16. The metal pillar 36 is provided on the input pad In. The series resonators S1 and S2 are connected in series between the input pad In and the output pad Out, and the parallel resonator P1 is connected in parallel between the input pad In and the output pad Out.

As illustrated in FIG. 3B, the annular metal layer 38 is provided on the peripheral edge of the substrate 20. An inductor is formed as the element 21 by the metal layer 24. One end of the element 21 is electrically connected to the input pad In of FIG. 3A via the metal pillar 36. The other end of the element 21 is connected to the annular metal layer 38 by the metal layer 24, and is connected to the ground terminal via the via wiring 16 of FIG. 3A. Thereby, the inductor is connected between the input terminal Tin and the ground terminal Tgnd.

Figure 4A:
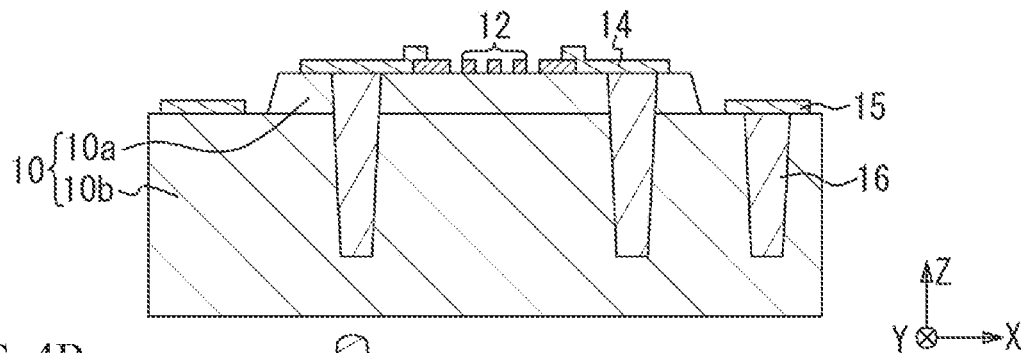
FIGS. 4A to 4D are cross-sectional views illustrating a method of manufacturing the acoustic wave device according to the first embodiment (No. 1)

FIGS. 4A to 4D and 5A to 5B are cross-sectional views illustrating a method of manufacturing the acoustic wave device according to the first embodiment. As illustrated in FIG. 4A, the piezoelectric substrate 10a at the peripheral edge of the substrate 10 to which the piezoelectric substrate 10a is bonded to an upper surface of the support substrate 10b is removed. Holes are formed in the substrate 10 and via wirings 16 are formed in the holes. The via wirings 16 do not penetrate the substrate 10. The acoustic wave element 12 and the metal layers 14 and 15 are formed on the substrate 10.

Figure 4B:
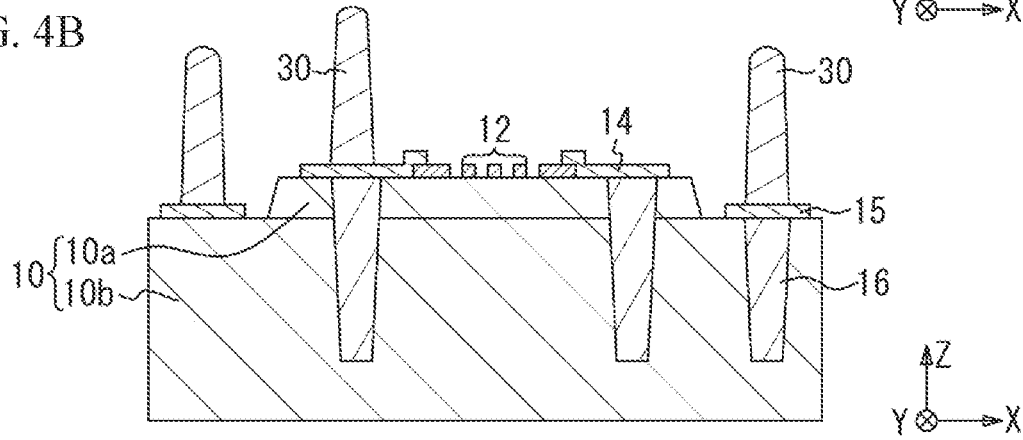

As illustrated in FIG. 4B, the metal layers 30 are formed on the metal layers 14 and 15. A plating method is used to form each metal layer 30. A side surface of an opening of the photoresist, which serves as a mask for plating, are inverse tapered (the width at the top of the opening is smaller than the width at the bottom of the opening), so that the side surface of the metal layer 30 are tapered (the width at the top of the metal layer 30 is smaller than the width at the bottom of the metal layer 30). Distances from the support substrate 10b to the upper surface of the metal layers 30 differ between the metal layer 30 provided on the piezoelectric substrate 10a and the metal layer 30 provided on the support substrate 10b from which the piezoelectric substrate 10a is removed.

Figure 4C:
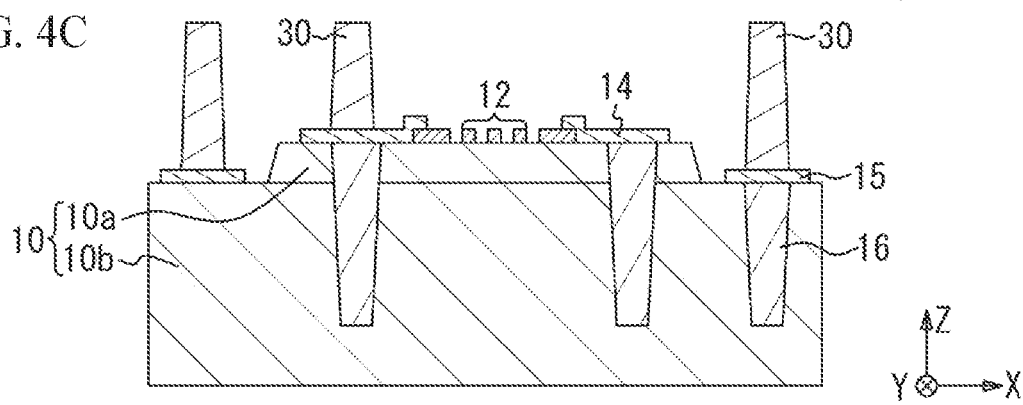

As illustrated in FIG. 4C, the upper surfaces of the metal layers 30 are ground. Thereby, the distances from the support substrate 10b to the upper surfaces of the metal layers 30 are the same as each other. The upper surface of each metal layer 30 is flattened by using, for example, a CMP (Chemical Mechanical Polishing) method. As a result, an arithmetic mean roughness of the upper surface of the metal layer 30 is set to, for example, 1 nm or less.

Figure 4D:
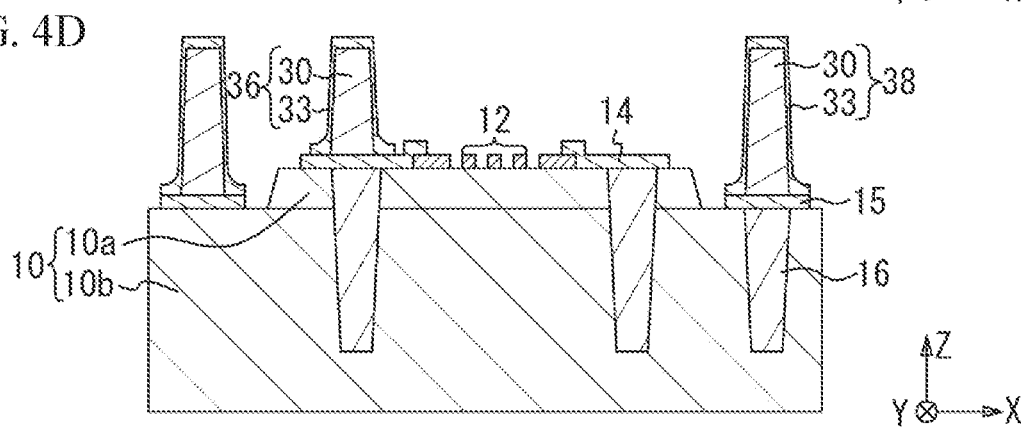

As illustrated in FIG. 4D, a metal layer 33 is formed so as to cover the metal layer 30. For example, a sputtering method and a lift-off method are used to form the metal layer 33. The side surface of the metal layer 30 does not have to be tapered, but if it is tapered, the covering property of the metal layer 33 is improved. Further, depending on the film forming conditions of the metal layer 33, the thickness of the metal layer 33 on the metal layer 14 (T4b and T5b in FIG. 1B) can be made thicker than the thickness of the metal layer 33 on the side surface of the metal layer 30 (T4a and T5a in FIG. 1B).

Figure 5A:
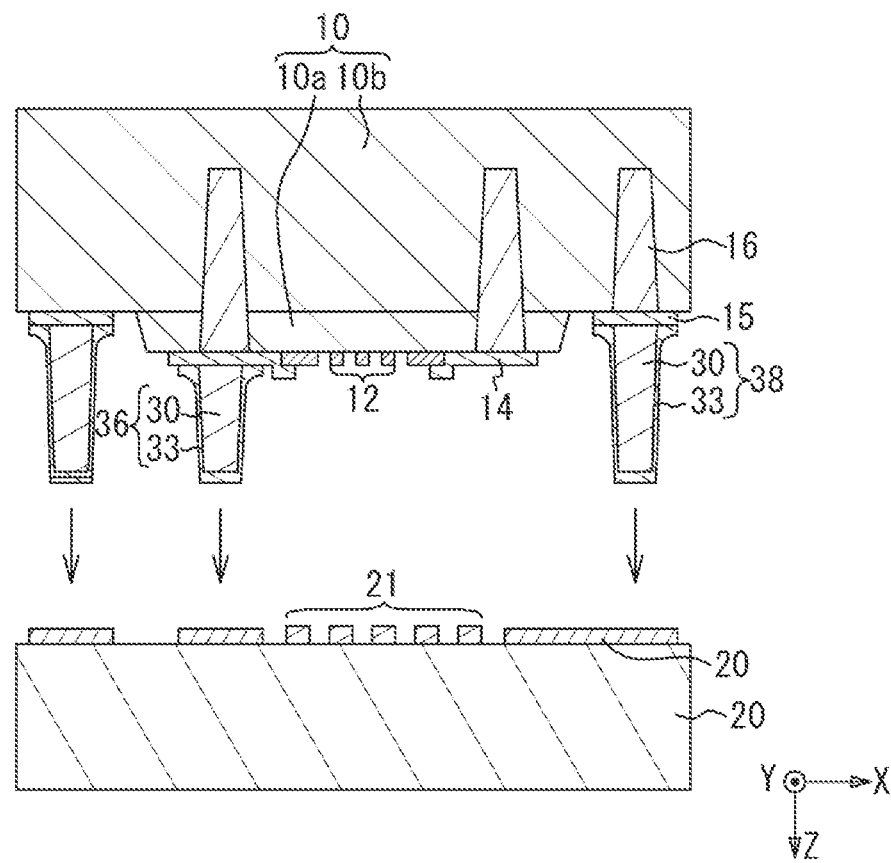
FIGS. 5A and 5B are cross-sectional views illustrating a method of manufacturing the acoustic wave device according to the first embodiment (No. 2)
Figure 5B:
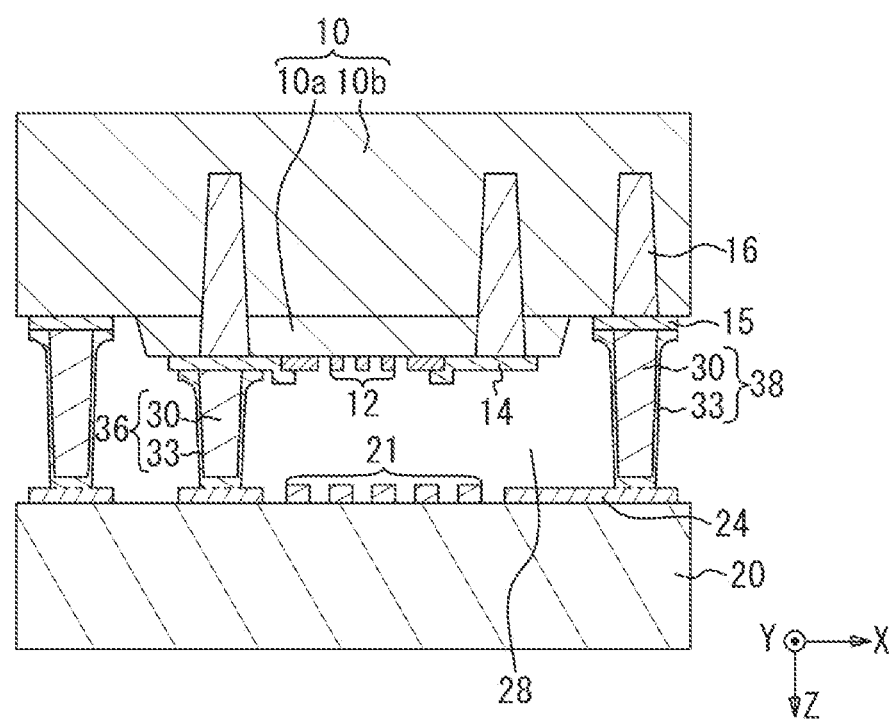

As illustrated in FIG. 5A, the substrate 10 of FIG. 4D is turned upside down and the substrate 10 is placed on the substrate 20. The upper surface of the metal layer 33 (that is, the upper surface of the metal layer 32) and the lower surface of the metal layer 24c are irradiated with a beam of an inert gas such as argon, so that the upper surface of the metal layer 33 and the lower surface of the metal layer 24c are activated. At this time, the arithmetic mean roughness Ra of the upper surface of the metal layer 33 and the lower surface of the metal layer 24c is 1 nm or less. Then, as illustrated in FIG. 5B, the metal layer 33 and the metal layer 24c on the metal layer 30 (see FIG. 1B) are bonded by pressurizing. Such a surface activation method is performed at room temperature (for example, 0° C. or more and 100° C. or less). The use of the same main components in the metal layer 24c and an upper part of metal layer 33 facilitate the bonding of the metal layers 33 and 24c at room temperature by the surface activation method. Then, a lower surface of the support substrate 10b is polished until the via wiring 16 is exposed. The terminal 18 is formed on the lower surface of the support substrate 10b. As described above, the acoustic wave device according to the first embodiment is manufactured.

First Comparative Example

Figure 6:
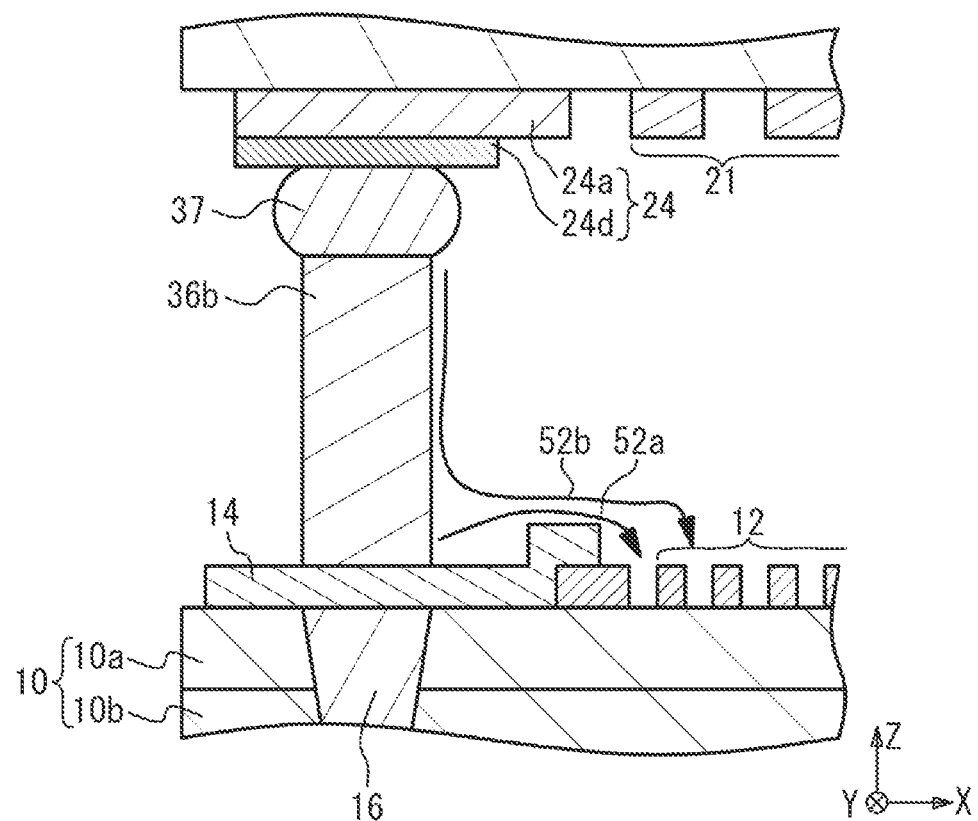
FIG. 6 is an enlarged view illustrating the vicinity of a metal pillar in a first comparative example.

FIG. 6 is an enlarged view illustrating the vicinity of a metal pillar in a first comparative example. In the first comparative example, a metal pillar 36b and the metal layer 24 are bonded by a solder 37. The metal layer 24 includes a metal layer 24d between the metal layer 24a and the solder 37. The metal layer 24d is a layer having good solder wettability, for example, a nickel layer. The piezoelectric substrate 10a is charged by a temperature and a stress. Thereby, an electric field is applied to the metal pillar 36b. When moisture is supplied while the electric field is applied, ion migration occurs in which the metal ions in the metal pillar 36 migrate. Copper and silver are elements that are likely to generate the ion migration. Similarly, tin in the solder 37 is an element that is likely to generate the ion migration. When copper or silver ions migrate to the acoustic wave element 12 as illustrated by an arrow 52a and tin ions migrate to the acoustic wave element 12 as illustrated by an arrow 52b, the acoustic wave element 12 deteriorates. For example, a region between the electrode fingers of the acoustic wave element 12 is short-circuited. A change in temperature or stress during the manufacturing or the use of the acoustic wave device causes the ion migration of copper or silver, which degrades the acoustic wave element 12.

According to the first embodiment, at least a part of the upper surface (first surface) of the substrate 10 (first substrate) is the piezoelectric substrate 10a (piezoelectric layer), and the acoustic wave element 12 is provided on the piezoelectric substrate 10a, as illustrated in FIG. 1B. The substrate 20 (second substrate) is provided via the acoustic wave element 12 and the space 28. The metal layer 14 (first metal layer) is provided on the upper surface (first surface on substrate 20 side) of the substrate 10 and is electrically connected to the acoustic wave element 12. The metal layer 24 (second metal layer) is provided on the lower surface of the substrate 20 (second surface on substrate 10 side). The metal layer 30 (third metal layer) connects the metal layer 14 to the metal layer 24.

In such a structure, the metal layer 30 thicker than the metal layers 14 and 24 contains copper or silver as a main component in order to reduce the resistance of the metal pillar 36. When the metal layer 14 is conductive to the acoustic wave element 12 provided on the piezoelectric substrate 10a which is easily charged, an electric field is applied to the metal layer 30. This may cause copper or silver in the metal layer 30 to migrate to the acoustic wave element 12 due to the ion migration as in the first comparative example, resulting in degradation of the acoustic wave element 12.

The metal layer 33 (first conductive layer) that is thinner than the metal layer 30 and contains a component other than copper, silver, and tin as a main component (that is, does not contain copper, silver, and tin as the main component) is provided so as to cover the side surface of the metal layer 30, and the upper surface (third surface) of the metal layer 30 in the region 50 surrounding the bonding region 51 to which the metal layer 30 is bonded to the metal layer 14. Thereby, the metal layer 33 serves as a barrier for the ion migration of copper or silver as illustrated by the arrow 52a in FIG. 6. Therefore, the ion migration of copper or silver ions to the acoustic wave element 12 can be suppressed. The metal layer 30 preferably contains copper as the main component. Thereby, the metal layer 30 can be easily formed by the plating method as compared with a case where the metal layer 30 contains silver as the main component.

The thickness T4b+T5b of the metal layer 33 covering the region 50 is thicker than the thickness T4a+T5a of the metal layer 33 covering the side surface of the metal layer 30. Thereby, the metal layer 33 in the region 50 further suppresses the ion migration of copper or silver from the metal layer 30 to the acoustic wave element 12.

The metal layer 33 further covers the upper surface (surface on the substrate 20 side) of the metal layer 30 and is directly bonded to the metal layer 24. Since the metal layer 33 does not contain tin as the main component, it is not necessary to use the solder 37 as in the first comparative example. This can prevent the ion migration of tin to the acoustic wave element 12 as illustrated by the arrow 52b.

The metal layer 34 (second conductive layer) is bonded to the metal layer 24, and the metal layer 32 (third conductive layer) is provided between the metal layers 34 and 30. Thereby, the metal layer 34 can be made of a material that can easily be bonded to the metal layer 24, and the metal layer 32 can be made of a material that can easily serve as a barrier for copper or silver.

The metal layer 24c in the metal layer 24 to be bonded to the metal layer 34 has the same main component as the main component of the metal layer 34. This can suppress the formation of an intermetallic compound between the metal layers 24c and 34. Therefore, the bonding quality between the metal layers 24c and 34 can be improved.

When the temperature of the piezoelectric substrate 10a becomes high, it becomes easy to be charged due to stress or the like. Further, when the temperature becomes high, the moisture is released into the space 28 from the metal layer 30 and the like formed by the plating method. The moisture in the space 28 facilitates the ion migration of copper or silver in the metal layer 30. When the metal layers 34 and 24 are bonded at the high temperature, the ion migration of copper or silver is likely to occur as described above. Therefore, the metal layers 24 and 34 are bonded at room temperature by using the surface activation method. This can suppress the ion migration.

The metal layer 34 contains gold or aluminum as a main component. This facilitates direct bonding of the metal layers 24 and 30. The metal layer 34 preferably contains gold as the main component. This further facilitates direct bonding of the metal layers 24 and 30. Also, gold and aluminum are less likely to generate the ion migration than copper or silver.

The metal layer 32 contains at least one element of titanium, chromium, tantalum, nickel, tungsten and ruthenium, and a nitride of these elements as the main component. This allows these elements or the nitride to function as a barrier for the ion migration of copper or silver. Therefore, the ion migration can be further suppressed.

The metal pillar 36 including the metal layer 30 connects the substrate 10 to the substrate 20. In this way, the metal pillar 36 preferably contains copper or silver as a main component in order to electrically connect the substrate 10 to the substrate 20. Therefore, it is preferable to provide the metal layer 33 that suppresses the ion migration. It should be noted that copper or silver may migrate from the metal layer 30 of the annular metal layer 38 to the acoustic wave element 12. Therefore, it is preferable to provide the metal layer 33 in the annular metal layer 38.

The substrate 10 includes the support substrate 10b and the piezoelectric substrate 10a provided on the support substrate 10b. A thermal expansion coefficient of the support substrate 10b is made smaller than a thermal expansion coefficient of the piezoelectric substrate 10a in a propagation direction of the acoustic wave. Thereby, the temperature change of the acoustic wave element 12 can be suppressed. However, since a thermal stress is applied to the piezoelectric substrate 10a, the piezoelectric substrate 10a is likely to be charged. Therefore, the electric field in the metal layer 30 becomes large, and the ion migration is likely to occur. Therefore, it is preferable to provide the metal layer 33 that suppresses the ion migration.

When the metal layer 30 is provided on the piezoelectric substrate 10a, the piezoelectric substrate 10a is charged by the stress applied from the metal layer 30 to the piezoelectric substrate 10a, and the electric field applied to the metal layer 30 is likely to increase. This facilitates the ion migration of copper or silver in the metal layer 30. Therefore, it is preferable to provide the metal layer 33.

The substrate 20 is not provided with an element and may be simply a lid. However, when the substrate 20 is provided with a passive element or the like, the metal layer 30 is preferably made of copper or silver as a main component in order to electrically connect the element 21 to the acoustic wave element 12. Therefore, it is preferable to provide the metal layer 33 that suppresses the ion migration.

No solder layer containing tin is provided between the substrates 10 and 20. This can suppress the ion migration of tin, as illustrated by the arrow 52b in FIG. 6.

The main component of a certain metal layer as a certain element or compound includes the unintentional or intentional inclusion of impurities in the certain metal layer. For example, the concentration of the certain element or compound in the metal layer is 50 atomic % or more, 80 atomic % or more, or 90 atomic % or more.

First Modification of First Embodiment

Figure 7A:
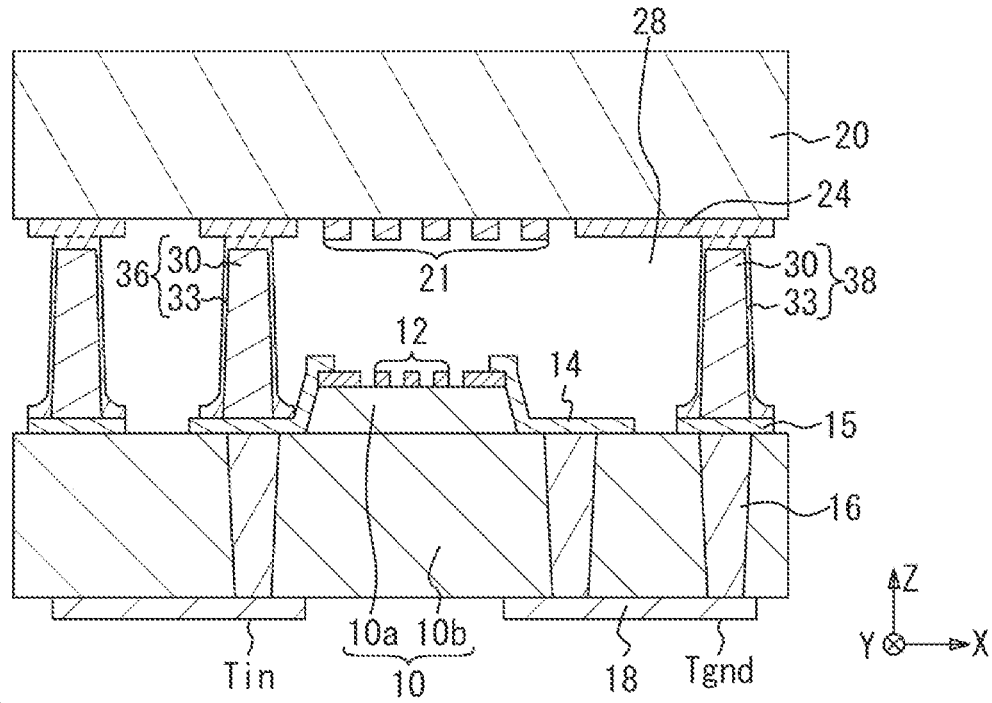
FIG. 7A is a cross-sectional view illustrating an acoustic wave device according to a first modification of the first embodiment.
Figure 7B:
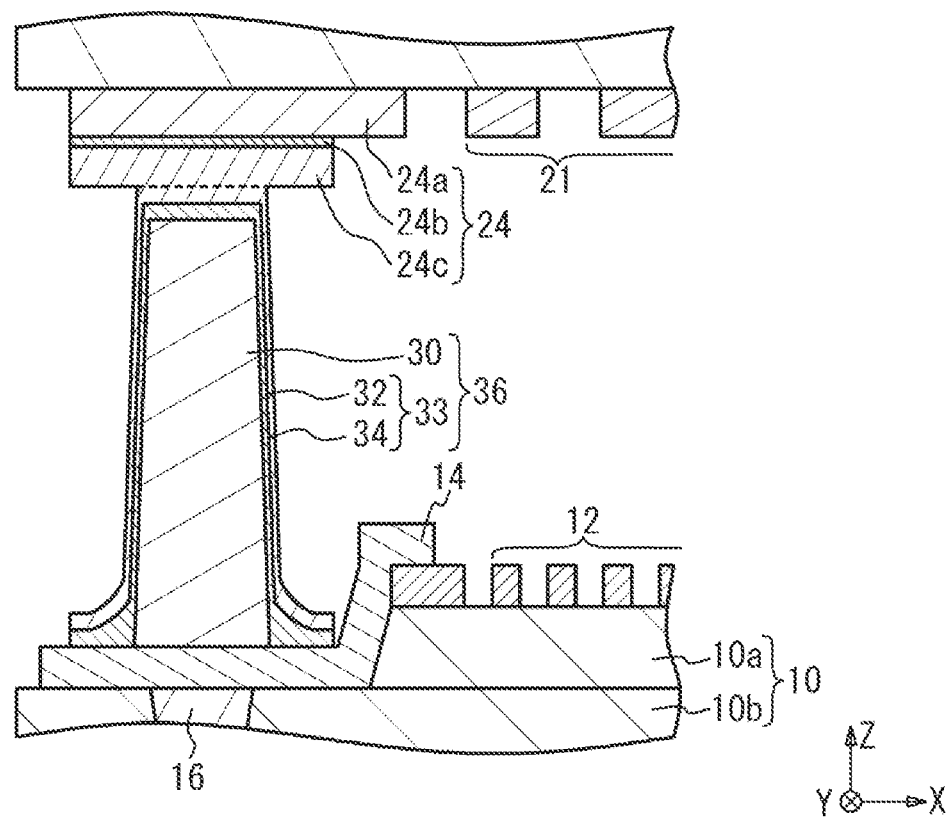
FIG. 7B is an enlarged view illustrating the vicinity of a metal pillar in FIG. 7A.

FIG. 7A is a cross-sectional view illustrating an acoustic wave device according to a first modification of the first embodiment. FIG. 7B is an enlarged view illustrating the vicinity of the metal pillar in FIG. 7A. As illustrated in FIGS. 7A and 7B, the piezoelectric substrate 10a under the metal pillar 36 is removed. The metal pillar 36 is provided on the support substrate 10b from which the piezoelectric substrate 10a is removed. Even when the metal pillar 36 is not provided on the piezoelectric substrate 10a as in the first modification of the first embodiment, if the acoustic wave element 12 and the metal layer 30 are electrically connected via the metal layer 14, an electric field is applied to the metal layer 30 due to electrification of the piezoelectric substrate 10a. Thus, the ion migration of copper or silver in the metal layer 30 may occur. Therefore, it is preferable to provide the metal layer 33. Other configurations are the same as those of the first embodiment, and the description thereof will be omitted.

Second Modification of First Embodiment

Figure 8A:
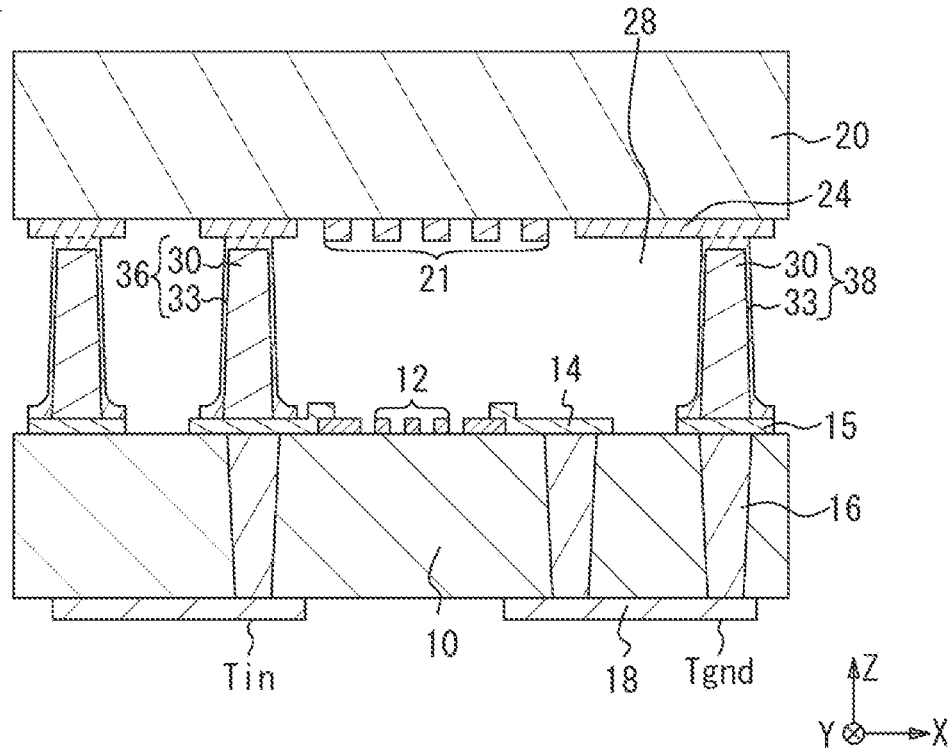
FIGS. 8A and 8B are cross-sectional views illustrating an acoustic wave device according to second and third modifications of the first embodiment, respectively.

FIG. 8A is a cross-sectional view illustrating an acoustic wave device according to a second modification of the first embodiment. As illustrated in FIG. 8A, the substrate 10 is a piezoelectric substrate, and the metal pillar 36 and the annular metal layer 38 are provided on the piezoelectric substrate. Other configurations are the same as those of the first embodiment, and the description thereof will be omitted.

Third Modification of First Embodiment

Figure 8B:
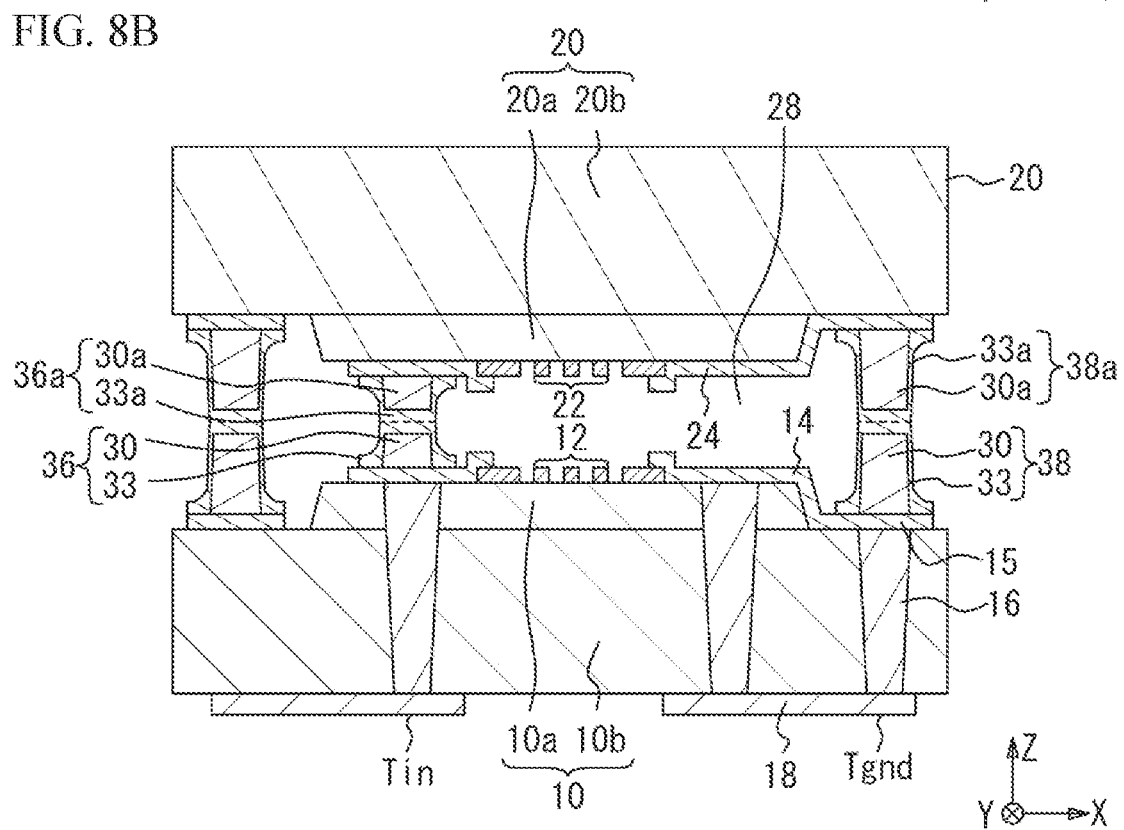

FIG. 8B is a cross-sectional view illustrating an acoustic wave device according to a third modification of the first embodiment. As illustrated in FIG. 8B, the substrate 20 includes a support substrate 20b and a piezoelectric substrate 20a provided under the support substrate 20b. An acoustic wave element 22 and the metal layer 24 are provided on a lower surface of the piezoelectric substrate 20a. The piezoelectric substrate 20a, the support substrate 20b, the acoustic wave element 22, and the metal layer 24 have the same configuration as the piezoelectric substrate 10a, the support substrate 10b, the acoustic wave element 12, and the metal layer 14, and the description thereof will be omitted. A metal pillar 36a and an annular metal layer 38a are provided under the metal layer 24. Each of the metal pillar 36a and the annular metal layer 38a includes metal layers 30a and 33a. The metal layers 30a and 33a have the same configuration as the metal layers 30 and 33, and the description thereof will be omitted. The metal layer 33 on an upper surface of the metal pillar 36 and the metal layer 33a on a lower surface of the metal pillar 36a are directly bonded to each other, and the metal layer 33 on an upper surface of the annular metal layer 38 and the metal layer 33a on a lower surface of the annular metal layer 38a are directly bonded to each other. Other configurations are the same as those of the first embodiment, and the description thereof will be omitted.

Fourth Modification of First Embodiment

Figure 9:
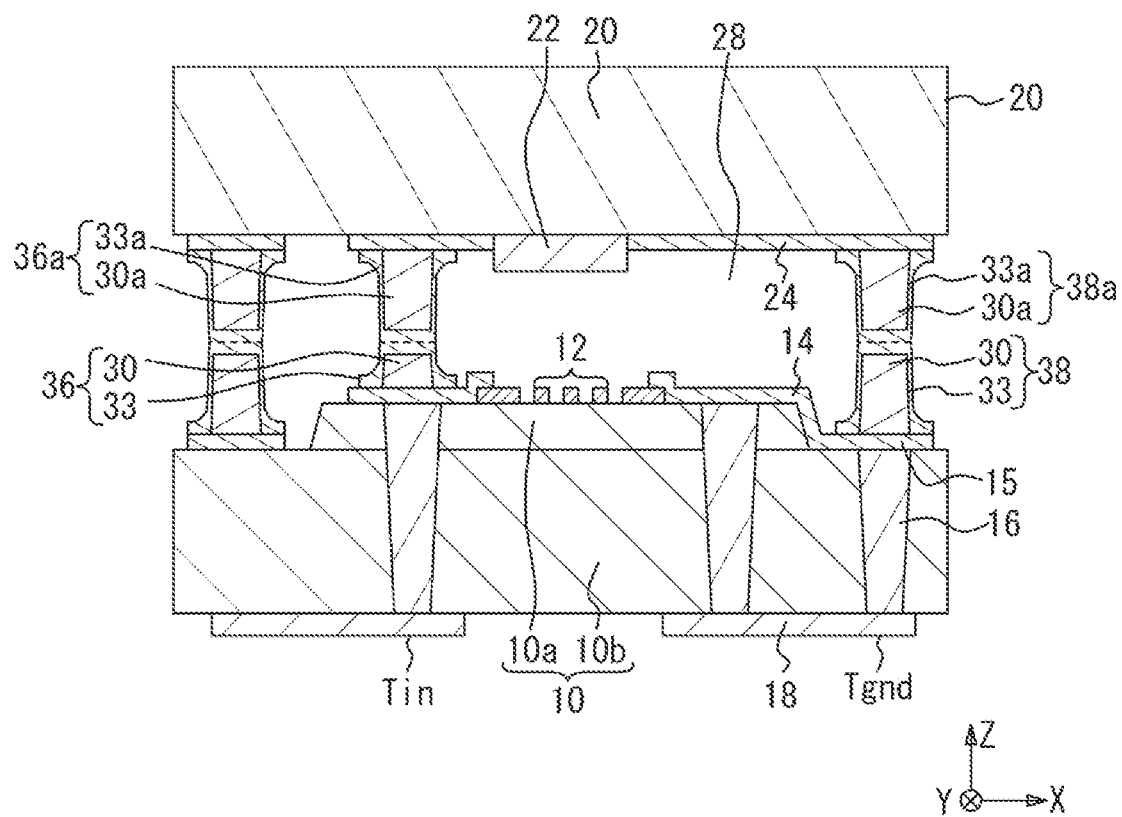
FIG. 9 is a cross-sectional view illustrating an acoustic wave device according to a fourth modification of the first embodiment.

FIG. 9 is a cross-sectional view illustrating an acoustic wave device according to a fourth modification of the first embodiment. As illustrated in FIG. 9, a piezoelectric thin film resonator is provided as the acoustic wave element 22 under the substrate 20.

Figure 10:
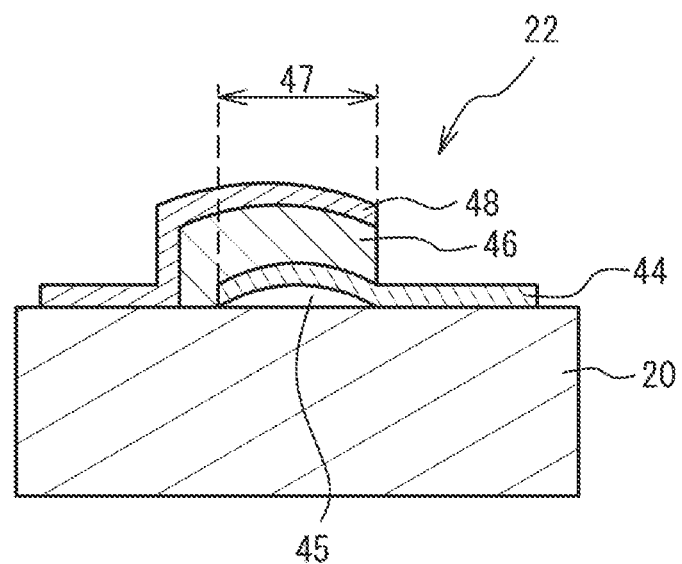
FIG. 10 is a cross-sectional view illustrating an acoustic wave element according to the fourth modification of the first embodiment.

FIG. 10 is a cross-sectional view illustrating an acoustic wave element according to the fourth modification of the first embodiment. As illustrated in FIG. 10, in the acoustic wave element 22 which is the piezoelectric thin film resonator, a piezoelectric film 46 is provided on the substrate 20. A lower electrode 44 and an upper electrode 48 are provided so as to sandwich the piezoelectric film 46. A gap 45 is formed between the lower electrode 44 and the substrate 10. A region where the lower electrode 44 and the upper electrode 48 that sandwich at least a part of the piezoelectric film 46 and face each other is a resonance region 47. In the resonance region 47, the lower electrode 44 and the upper electrode 48 excite acoustic waves in a thickness longitudinal vibration mode in the piezoelectric film 46. The lower electrode 44 and the upper electrode 48 are metal films such as a ruthenium film. The piezoelectric film 46 is, for example, an aluminum nitride film. An acoustic reflection film that reflects the acoustic waves may be provided instead of the gap 45. Other configurations are the same as those of the third modification of the first embodiment, and the description thereof will be omitted.

As in the third and the fourth modifications of the first embodiment, at least a part of the lower surface (second surface) of the substrate 20 is the piezoelectric substrate 20a (another piezoelectric layer), and the acoustic wave element 22 (another acoustic wave element) is provided on the piezoelectric substrate 20a. The metal layer 30a (fourth metal layer) connects the metal layer 24 to the metal layer 30, is thicker than the metal layers 14 and 24, and contains copper or silver as a main component. The metal layer 33a (fourth conductive layer) covers the side surface of the metal layer 30a and the lower surface (fourth surface) of the metal layer 24 in another region surrounding a region where the metal layer 30a bonds the metal layer 24. The metal layer 33a is thinner than the metal layer 24 and contains components other than copper, silver and tin as main components. This can suppress the ion migration of copper or silver in the metal layer 30a to the acoustic wave element 22. Since the annular metal layers 38 and 38a are bonded to each other, the strength is easily weakened. Therefore, the widths of the annular metal layers 38 and 38a are preferably larger than the width of the annular metal layer 38 of the first embodiment.

Fifth Modification of First Embodiment

Figure 11:
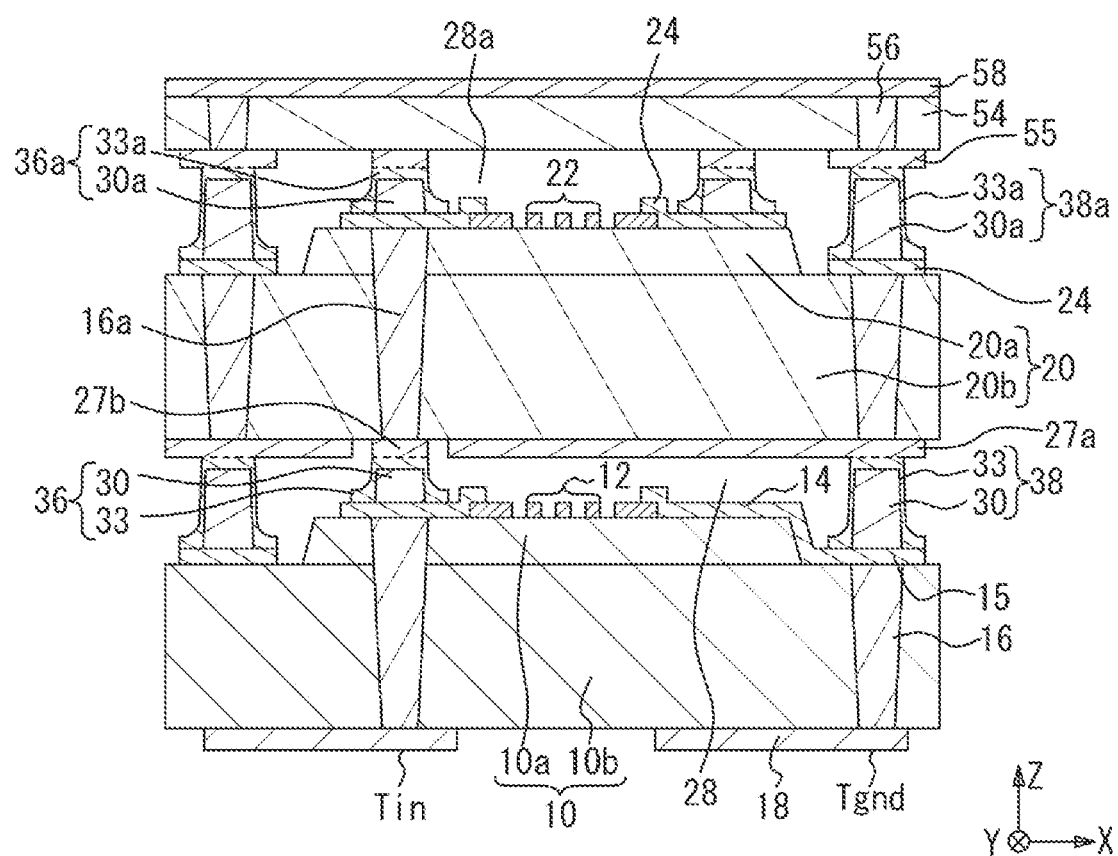
FIG. 11 is a cross-sectional view illustrating an acoustic wave device according to a fifth modification of the first embodiment.

FIG. 11 is a cross-sectional view illustrating an acoustic wave device according to a fifth modification of the first embodiment. As illustrated in FIG. 11, the piezoelectric substrate 20a in the substrate 20 is provided on the upper surface of the support substrate 20b. Metal layers 27a and 27b are provided on the lower surface of the substrate 20. The metal pillar 36 and the annular metal layer 38 are bonded to the metal layers 27a and 27b, respectively. The metal layer 27a functions as a shield. A lid 54 is provided above the substrate 20. A metal layer 55 is provided on the lower surface of the lid 54. A via wiring 56 that penetrates the lid 54 is provided. A metal layer 58 is provided on the lid 54. The via wiring 56 connects the metal layer 55 to the metal layer 58. The metal pillar 36a and the annular metal layer 38a are bonded to the metal layer 55. The lid 54 and the annular metal layer 38a seal the acoustic wave element 22 in a space 28a. Other configurations are the same as those of the third modification of the first embodiment, and the description thereof will be omitted. An element may be provided on the substrate 20 as in the fifth modification of the first embodiment.

In the first embodiment and its modifications, an example of the inductor and the acoustic wave element 22 (the piezoelectric thin film resonator or acoustic surface wave resonator) as the element 21 is described. However, the element 21 may be a passive element such as an inductor or a capacitor, an active element including a transistor, or a MEMS (Micro Electro Mechanical Systems) element.

Second Embodiment

Figure 12A:
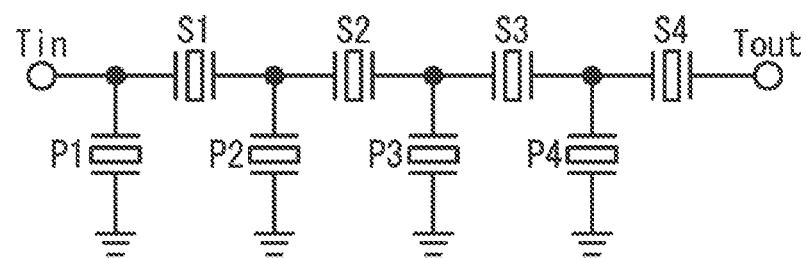
FIG. 12A is a circuit diagram illustrating a filter according to a second embodiment.

FIG. 12A is a circuit diagram illustrating a filter according to a second embodiment. As illustrated in FIG. 12A, one or a plurality of series resonators S1 to S4 are connected in series between an input terminal Tin and an output terminal Tout. One or more parallel resonators P1 to P4 are connected in parallel between the input terminal Tin and the output terminal Tout. The filter of the second embodiment may be formed by the acoustic wave element 12. The number of series resonators and the number of parallel resonators can be set as appropriate. An example of a ladder type filter is described as a filter, but the filter may be a multiple mode type filter.

Figure 12B:
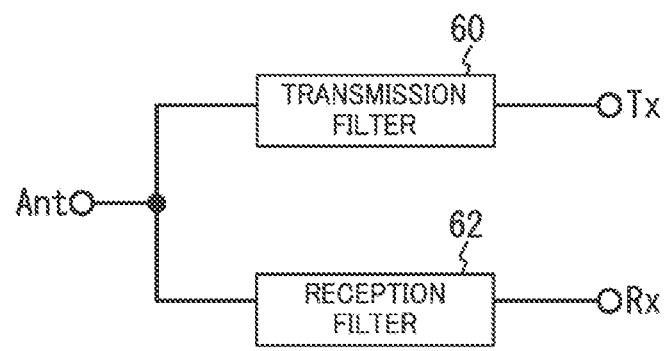
FIG. 12B is a circuit diagram illustrating a duplexer according to a first modification of the second embodiment.

FIG. 12B is a circuit diagram illustrating a duplexer according to a first modification of the second embodiment. As illustrated in FIG. 12B, a transmission filter 60 is connected between a common terminal Ant and a transmission terminal Tx. A reception filter 62 is connected between the common terminal Ant and a reception terminal Rx. The transmission filter 60 passes, to the common terminal Ant, signals in a transmission band among the high frequency signals input from the transmission terminal Tx as transmission signals, and suppresses signals having other frequencies outside the transmission band. The reception filter 62 passes, to the reception terminal Rx, signals in a reception band among the high frequency signals input from the common terminal Ant as reception signals, and suppresses signals having other frequencies outside the reception band. At least one of the transmission filter 60 and the reception filter 62 can be the filter of the second embodiment.

Although an example of the duplexer is described as the multiplexer, the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a first substrate having at least a part of a first surface that is a piezoelectric layer;
an acoustic wave element provided on the first surface of the piezoelectric layer;
a second substrate provided apart from the first substrate via the acoustic wave element and a gap;
a first metal layer provided on the first surface and conductively connected to the acoustic wave element;
a second metal layer provided on a second surface of the second substrate on a first substrate side;
a third metal layer that connects the first metal layer to the second metal layer, is thicker than the first metal layer and the second metal layer, and contains copper or silver as a main component; and
a first conductive layer that covers a side surface of the third metal layer and a third surface of the first metal layer on a second substrate side in a region surrounding another region where the third metal layer is bonded to the first metal layer, is thinner than the third metal layer, and contains a component other than copper, silver, and tin as a main component.

2. The acoustic wave device as claimed in claim 1, wherein
a first portion of the first conductive layer covering the third surface is thicker than a second portion of the first conductive layer covering the side surface of the third metal layer.

3. The acoustic wave device as claimed in claim 1, wherein
the first conductive layer further covers a surface of the third metal layer on the second substrate side and is directly bonded to the second metal layer.

4. The acoustic wave device as claimed in claim 3, wherein
the first conductive layer includes a second conductive layer directly bonded to the second metal layer, and a third conductive layer provided between the second conductive layer and the third metal layer.

5. The acoustic wave device as claimed in claim 4, wherein
a region in the second metal layer to be bonded to the second conductive layer has the same main component as a main component of the second conductive layer.

6. The acoustic wave device as claimed in claim 4, wherein
the second conductive layer contains gold or aluminum as the main component.

7. The acoustic wave device as claimed in claim 4, wherein
the third conductive layer contains at least one element of titanium, chromium, tantalum, nickel, tungsten and ruthenium, and a nitride of the at least one element as the main component.

8. The acoustic wave device as claimed in claim 1, further comprising
a metal pillar containing the third metal layer.

9. The acoustic wave device as claimed in claim 1, wherein
the first substrate includes a support substrate, and the piezoelectric layer provided on the support substrate.

10. The acoustic wave device as claimed in claim 1, further comprising
an element provided on a surface of the second substrate on the first substrate side.

11. A filter comprising the acoustic wave device as claimed in claim 10.

12. A multiplexer comprising the filter as claimed in claim 11.

13. The acoustic wave device as claimed in claim 1, wherein
at least a part of the second surface of the second substrate is another piezoelectric layer, and
the acoustic wave device further includes:
another acoustic wave element provided on the another piezoelectric layer;
a fourth metal layer that connects the second metal layer to the third metal layer, is thicker than the first metal layer and the second metal layer, and contains copper or silver as a main component; and
a fourth conductive layer that covers a side surface of the fourth metal layer and a fourth surface of the second metal layer on the first substrate side in a region surrounding another region where the fourth metal layer is bonded to the second metal layer, is thinner than the fourth metal layer, and contains a component other than copper, silver, and tin as a main component.

* * * * *